US009364861B2

(12) United States Patent
Lasarov et al.

(10) Patent No.: US 9,364,861 B2
(45) Date of Patent: Jun. 14, 2016

(54) TUBE-SHAPED PART AND AN ASSOCIATED METHOD OF MANUFACTURE

(75) Inventors: Harri Aukusti Lasarov, Sunnyvale, CA (US); Ville Henrikki Vehkapera, Cupertino, CA (US)

(73) Assignee: Nokia Technologies Oy, Espoo (FI)

( * ) Notice: Subject to any disclaimer, the term of this patent is extended or adjusted under 35 U.S.C. 154(b) by 897 days.

(21) Appl. No.: 13/536,275

(22) Filed: Jun. 28, 2012

(65) Prior Publication Data

US 2014/0000747 A1 Jan. 2, 2014

(51) Int. Cl.
*H05K 5/00* (2006.01)
*H05K 7/00* (2006.01)
*B05D 7/22* (2006.01)
*B05D 1/32* (2006.01)

(52) U.S. Cl.
CPC ... *B05D 7/22* (2013.01); *B05D 1/32* (2013.01)

(58) Field of Classification Search
CPC ..... G05F 1/1626; G05F 3/016; H04M 1/0252
USPC ............... 361/679.01–679.09, 679.1–679.19, 361/679.21–679.29, 679.31–679.45, 361/679.55–679.6, 724–747
See application file for complete search history.

(56) References Cited

U.S. PATENT DOCUMENTS

| | | | | |
|---|---|---|---|---|
| 2006/0254707 | A1 | 11/2006 | Iandoli | |
| 2009/0208739 | A1* | 8/2009 | Husemann et al. | 428/354 |
| 2009/0269500 | A1* | 10/2009 | Pastrana et al. | 427/325 |
| 2010/0026589 | A1* | 2/2010 | Dou et al. | 343/702 |
| 2010/0065212 | A1* | 3/2010 | Husemann et al. | 156/332 |
| 2010/0225600 | A1* | 9/2010 | Dai et al. | 345/173 |
| 2011/0188225 | A1* | 8/2011 | Wang et al. | 361/807 |
| 2012/0069517 | A1 | 3/2012 | Prest et al. | |

FOREIGN PATENT DOCUMENTS

| | | |
|---|---|---|
| GB | 828925 | 2/1960 |
| GB | 971733 | 10/1964 |
| WO | WO 2011/114190 A1 | 9/2011 |

* cited by examiner

*Primary Examiner* — Jerry Wu
(74) *Attorney, Agent, or Firm* — Alston & Bird LLP

(57) ABSTRACT

A tube-shaped assembly, a tube-shaped part and an associated method of manufacturing the same are provided. In regards to a method, a glass or plastic tube is provided that has a maskant positioned upon an interior region of the tube to define a window. The method also includes coating an interior surface of the tube with a tinted anti-splinter material having a dye or pigment mixed therein. The method also includes curing the tinted anti-splinter material and removing the maskant such that the interior region is free of the tinted anti-splinter material. A tube-shaped part is also provided that includes a glass or plastic tube and a maskant positioned upon an interior region of the tube to define a window. The tube-shaped part also includes a tinted anti-splinter material having a dye or pigment mixed therein.

15 Claims, 6 Drawing Sheets

TUBE-SHAPED PART AND AN ASSOCIATED METHOD OF MANUFACTURE

TECHNOLOGICAL FIELD

An example embodiment of the present disclosure relates generally to tube-shaped parts and associated methods for manufacture and, more particularly, to tube-shaped parts having a decorative anti-splinter film and associated methods for manufacture.

BACKGROUND

Tube-shaped parts made of glass or plastic are utilized for various purposes. For example, electronic devices, such as various types of mobile terminals, e.g., cellular telephones, smartphones, music players, gaming devices or the like, may include a tube-shaped part that serves as the housing and that structurally protects and carries the internal electronic components that are positioned within the tube-shaped part.

In order to provide enhanced protection for the internal electronic components, the tube-shaped part may be closed and seamless. In this regard, the tube-shaped part may have opposed open ends, but may otherwise be closed and seamless so as to not define any openings in the sidewalls of the tube-shaped part. While a closed and seamless tube-shaped part may provide improved protection for the internal electronic components, a closed and seamless tube-shaped part may create manufacturing challenges.

In this regard, a tube-shaped part formed of glass or plastic desirably includes an anti-splinter film, such as a coating of an anti-splinter film, that is intended to prevent splinters from being generated in an instance in which a glass or plastic tube is broken or shattered. Additionally, it may be desirable to decorate the tube-shaped part, such as by tinting the tube-shaped part to have a desired color. As a result of the closed and seamless construction of a tube-shaped part, however, it may prove difficult to coat the tube-shaped part with an anti-splinter film and to provide the desired decoration, such as tinting, to the tube-shaped part. In this regard, it is generally desirable to apply the anti-splinter film and any decoration, such as tinting, to an interior surface of the tube-shaped part. However, the closed and seamless construction of a tube-shaped part may limit the accessibility to the interior surface of the tube-shaped part and may make it difficult to apply the anti-splinter film and the decoration, such as the tinting, to the interior surface of the tube-shaped part.

BRIEF SUMMARY

A tube-shaped assembly, a tube-shaped part and an associated method of manufacturing the same are provided in accordance with an example embodiment of the present invention. The tube-shaped part of one embodiment is a closed and seamless tube, thereby providing protection for internal electronic components with a housing that is aesthetically desirable. Additionally, the method of manufacturing the tube-shaped part and the tube-shaped assembly permits efficient fabrication of the tube-shaped part in a repeatable manner.

In one embodiment, a method is provided that includes providing a glass or plastic tube, such as a closed or seamless tube, having a maskant positioned upon an interior region of the tube to define a window. The method of this embodiment also includes coating an interior surface of the tube with a tinted anti-splinter material having a dye or pigment mixed therein. The method of this embodiment also includes curing the tinted anti-splinter material and removing the maskant such that the interior region is free of the tinted anti-splinter material.

In order to coat the interior surface of the tube with the tinted anti-splinter material, tinted anti-splinter material, such as tinted anti-splinter material in a liquid state, may be injected through one end of the tube and excess anti-splinter material may be permitted to exit through the opposite end of the tube. In order to coat the interior surface of the tube with the tinted anti-splinter material, the tube may be positioned so that the tinted anti-splinter material goes through the tube as a result of gravitational force.

The method of one embodiment also includes applying an optical clear adhesive to the interior region of the tube previously covered by the maskant. The method of this embodiment also includes securing a display or a touch stack within the tube with the optical clear adhesive. In regards to applying the optical clear adhesive, the optical clear adhesive may be applied so as to extend beyond the interior region of the tube previously covered by the maskant. In one embodiment, the optical clear adhesive is applied by applying an optical clear adhesive tape and then removing a protective layer from the optical clear adhesive tape after its application. Alternatively, the optical clear adhesive may be applied as a fluid.

In another embodiment, an apparatus is provided that includes a glass or plastic tube, such as a closed and seamless tube which, in one embodiment, has opposed ends that are open. The apparatus of this embodiment also includes a maskant positioned upon an interior region of the tube to define a window. The apparatus of this embodiment also includes a tinted anti-splinter material having a dye or pigment mixed therein.

In a further embodiment, an apparatus is provided that includes a glass or plastic tube, such as a closed and seamless tube which, in one embodiment, has opposed ends that are open. The apparatus of this embodiment also includes a tinted anti-splinter material having a colorant, such as dye or a pigment, mixed therein that coats an interior surface of the tube. However, a window is defined through the tube that is free of the tinted anti-splinter material. The apparatus also includes an optical clear adhesive on at least a portion of the window and an internal electronic component, such as a display or a touch stack, within the tube and secured to the optical clear adhesive in at least partial alignment with the window. The optical clear adhesive of one embodiment extends beyond the window. In this regard, the edges of the optical clear adhesive may overlap with the tinted anti-splinter material.

BRIEF DESCRIPTION OF THE DRAWINGS

Figure 1:
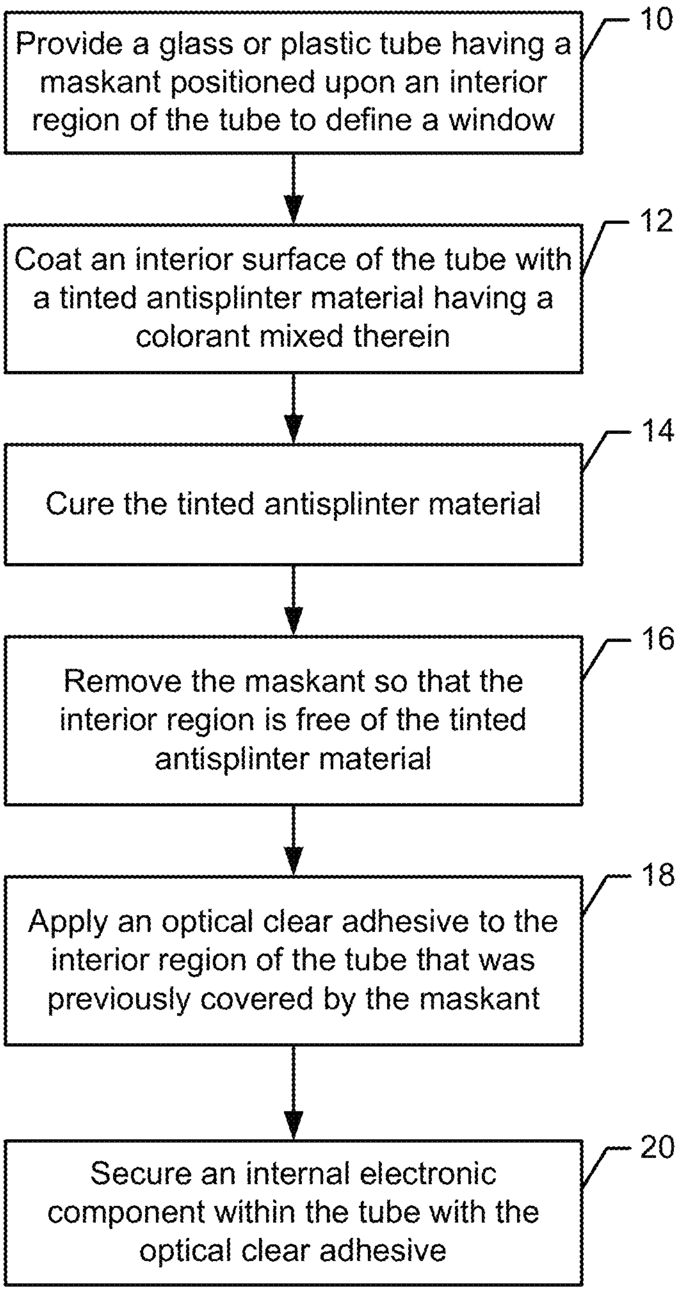
Figure 2:
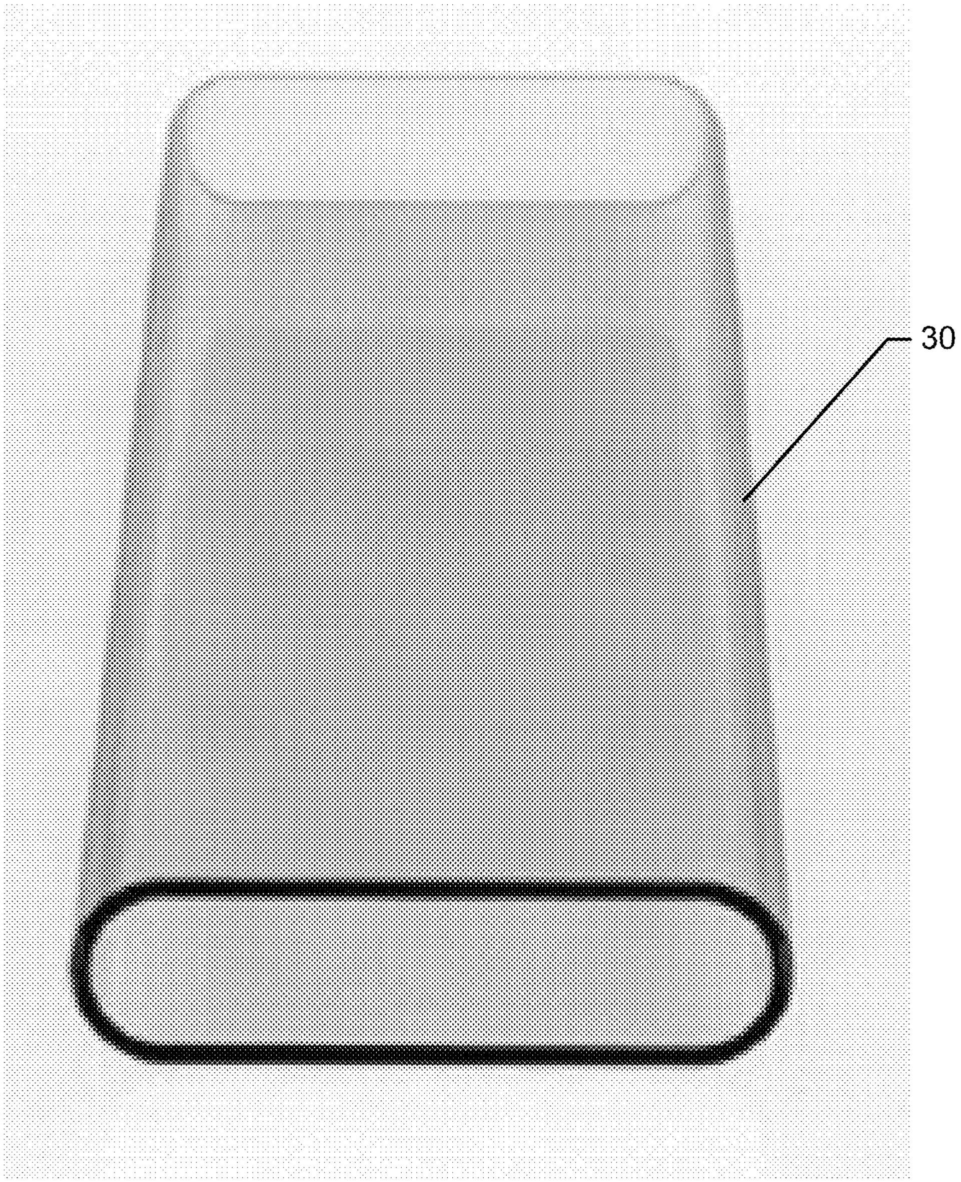
Figure 3:
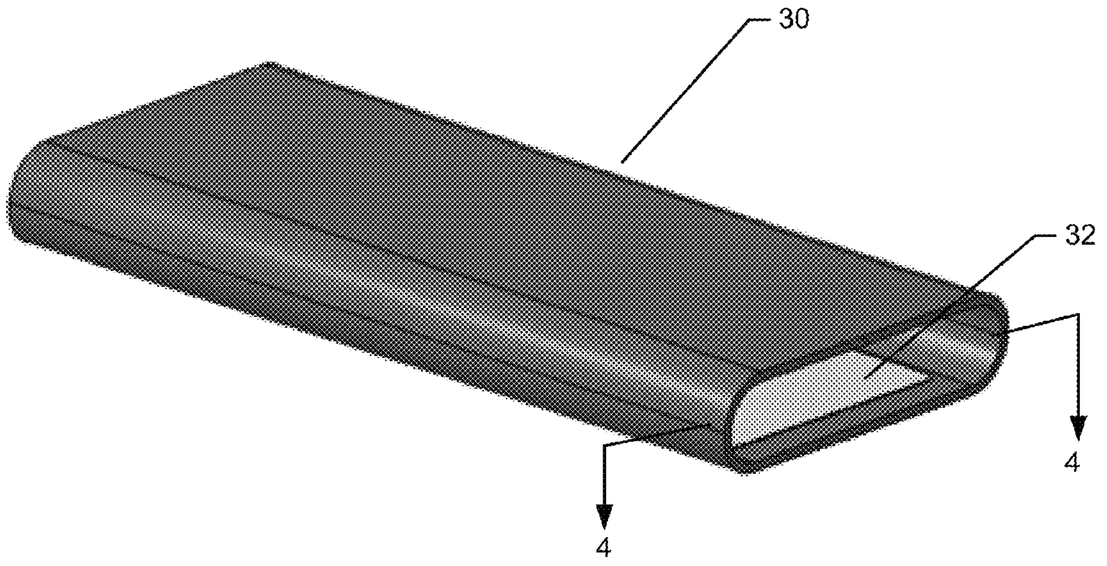
Figure 4:
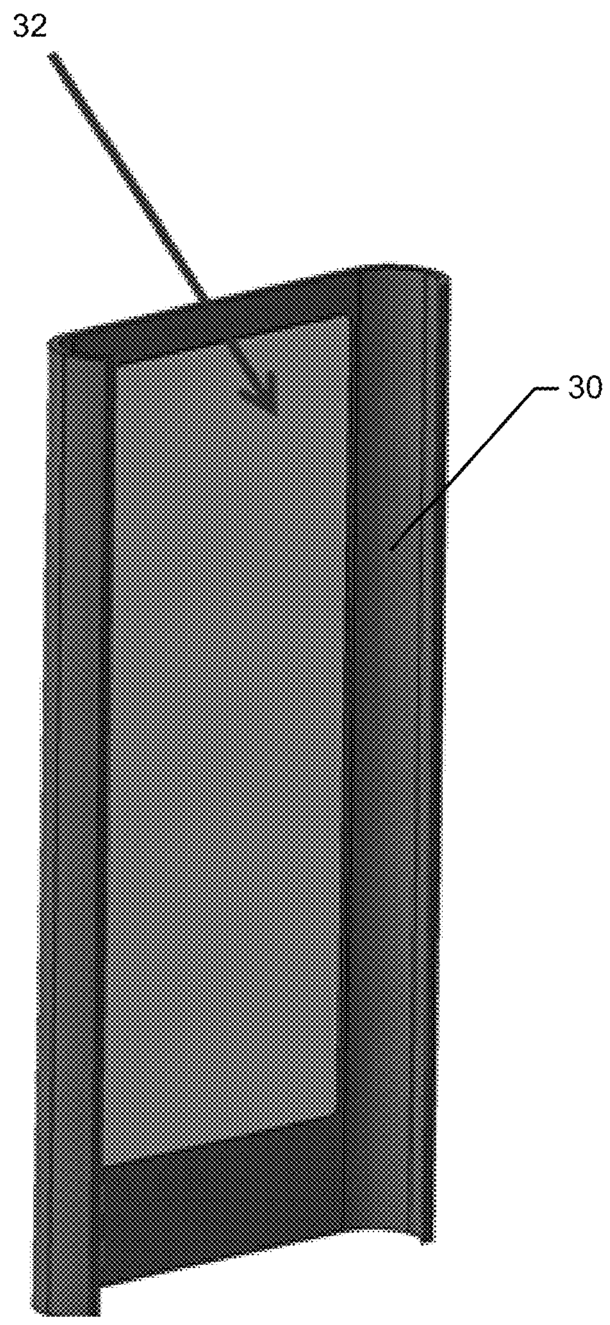
Figure 5:
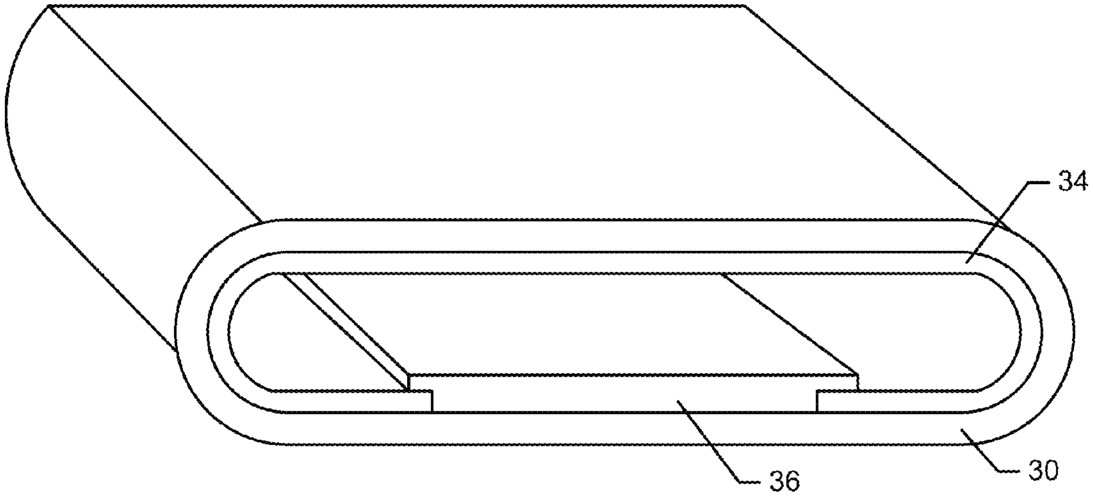
Figure 6:
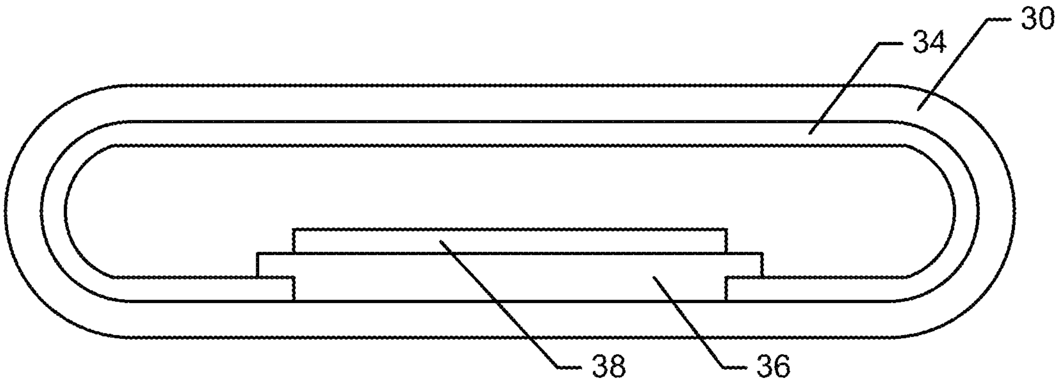

Having thus described example embodiments of the present disclosure in general terms, reference will now be made to the accompanying drawings, which are not necessarily drawn to scale, and wherein:

FIG. 1 is a flowchart illustrating operations performed in order to manufacture a tube-shaped part in accordance with an example embodiment of the present invention;

FIG. 2 is a perspective view of a glass tube;

FIG. 3 is a perspective view of a glass tube having a maskant positioned upon an interior region of the tube to define a window in accordance with an example embodiment of the present invention;

FIG. 4 is a cross-sectional, perspective view of a portion of the tube-shaped part taken along line 4-4 of FIG. 3 in order to further illustrate the maskant positioned upon the interior region of the tube to define a window;

FIG. 5 is a perspective view of a tube-shaped part including an optical clear adhesive on the interior region of the tube previously covered by the maskant in accordance with an example embodiment of the present invention; and FIG. 6 is an end view of a tube-shaped assembly in accordance with an example embodiment of the present invention.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms “data,” “content,” “information,” and similar terms may be used interchangeably to refer to data capable of being transmitted, received and/or stored in accordance with embodiments of the present invention. Thus, use of any such terms should not be taken to limit the spirit and scope of embodiments of the present invention.

An apparatus, such as a tube-shaped part or a tube-shaped assembly, and an associated method for manufacturing the same are provided in accordance with an example embodiment of the present invention. The tube-shaped part may serve as a housing for various internal electronic components, such as a display, a touch stack or the like. As such, the resulting tube-shaped assembly may comprise various types of mobile terminals, such as a personal digital assistant (PDA), pager, mobile television, mobile telephone, gaming device, camera, camera phone, video recorder, audio/video player, radio, global positioning system (GPS) device, navigation device, or any combination of the aforementioned, and other types of voice and text communications systems.

As shown in block 10 of FIG. 1, a method for manufacturing a tube-shaped part includes providing a glass or plastic tube 30. The glass or plastic tube may have various sizes, shapes and designs including, for example, nonsymmetrical wall thicknesses, grooves, etc. The glass or plastic tube may be asymmetrically shaped, such as by having a flat front surface and a rounded rear surface. However, one glass or plastic tube that is provided by way of example, but not of limitation is depicted in FIG. 2. In this embodiment, the glass or plastic tube is a somewhat flattened tube having opposed planar surfaces and rounded or arcuate side surfaces interconnecting the opposed planar opposed surfaces. The glass or plastic tube may be fabricated in various manners, but, in one embodiment, is extruded and is then cut to a desired length, such as with a laser. The edges and outer surface of the glass or plastic tube may then be polished. The glass or plastic tube may also be chemically, tempered and/or atomic layer deposit (ALD) strengthened and/or the edges of the glass or plastic tube may be polished to remove scratches, dents or other weak points in one embodiment so as to increase its mechanical properties. While the glass or plastic tube may be formed of various materials, the tube of one embodiment is formed from Duran® glass, Gorilla® glass or other types of glass.

As shown in FIG. 2, the glass or plastic tube 30 of one embodiment is a closed and seamless tube. Thus, the glass or plastic tube does not include any openings or seams in its outer surface, such as in the opposed planar surfaces or the arcuate side surfaces. Instead, the glass or plastic tube of one embodiment only includes opposed open ends.

As also indicated in block 10 of FIG. 1 and as shown in FIGS. 3 and 4, a maskant 32 is positioned upon an interior region of the tube 30 so as to define a window. Various types of maskant may be utilized, but a tape, such as masking tape, is utilized in one embodiment in order to define the window. In this regard, the maskant is temporarily adhered to an interior region of the tube, such as by an adhesive carried by the tape. While windows of various shapes and sizes may be defined, the window illustrated in the embodiment of FIGS. 3 and 4 is defined on one of the generally planar surfaces of the glass or plastic tube and covers a majority of the generally planar surface, but does not extend to the opposed ends of the glass or plastic tube. While a maskant that defines a single window is illustrated in FIGS. 3 and 4, maskant may be applied to two or more interior regions of the glass or plastic tube so as to define a corresponding plurality of windows in other embodiments.

As shown in block 12 of FIG. 1, the interior surface of the tube 30 may then be coated with a tinted anti-splinter material having a colorant mixed therein. The anti-splinter material may be an anti-splinter polymer that prevents the glass or plastic tube from generating splinters in an instance in which the glass or plastic tube is broken. In an example embodiment of the present invention, the anti-splinter material has a colorant, such as a dye or pigment, mixed therein prior to coating of the interior surface of the tube with the tinted anti-splinter material. Various colorants, such as dyes and pigments, may be mixed into the anti-splinter material depending upon the decorative effect that is desired for the tube, such as depending upon the desired color and/or the desired shade of color. Other than the interior region of the tube that is covered by the maskant, all other portions of the interior surface of the tube may be coated in one embodiment. Additionally, the maskant may be coated, that is, the interior surface of the maskant that faces away from the tube, may be coated with the tinted anti-splinter material. However, the maskant need not be coated with the tinted anti-splinter material in other embodiments.

The interior surface of the tube 30 may be coated with the tinted anti-splinter material in various manners, such as by spray or pad printing. In one embodiment, however, the interior surface of the tube is coated with the tinted anti-splinter material by injecting tinted anti-splinter material through one end of the tube. Although the tinted anti-splinter material may be injected in various manners, the tube may be rotated in one embodiment while the tinted anti-splinter material is injected in order to facilitate a uniform coating of the interior surface of the tube. In one embodiment, the tinted anti-splinter material may optionally be injected while a vacuum is pulled through the tube in order to facilitate coating of the tube. The excess tinted anti-splinter material may exit through the opposite end of the tube. In order to facilitate the injection of the tinted anti-splinter material into the tube, the tinted anti-splinter material of this embodiment may be in a liquid state at the time of its injection and while flowing through the tube. In order to facilitate the flow of the anti-splinter material through the tube from one end at which the tinted anti-splinter material is injected to the opposite end at which the excess tinted anti-splinter material exits the tube, the tube may be positioned so that the tinted anti-splinter material flows through the tube as a result of gravitational forces. In this regard, the tube may be positioned such that the one end of the tube through which the tinted anti-splinter material is injected is higher than the opposite end of the tube through which the excess tinted anti-splinter material exits the tube.

Although the tinted anti-splinter material may be injected through the tube 30 a single time, the method of other embodiments may repeatedly inject the tinted anti-splinter material through the tube so as to ensure that all interior surfaces of the tube are coated with the tinted anti-splinter material and to increase the probability that the thickness of the film 34 of tinted anti-splinter material is consistent and that the resulting color provided by the tinted anti-splinter material is consistent throughout the entire tube. Although the coating of anti-splinter material may have various thicknesses in different embodiments, the coating of anti-splinter material of one embodiment has a thickness of between 0.01 mm and 0.2 mm, such as about 0.1 mm.

The tinted anti-splinter material that coats the interior surface of the tube 30 may then be cured, as shown in block 14 of FIG. 1. The tinted anti-splinter material of one embodiment may be cured with ultraviolet light. Additionally or alternatively, the tinted anti-splinter material may be cured by subjecting the tinted anti-splinter material to an increased temperature. Typically, the tinted anti-splinter material is cured with ultraviolet light having a wavelength and at a temperature and for a time that is defined, for example, by the material supplier and the material chemistry. In one embodiment, the anti-splinter material is a two-component system comprised of a resin and a catalyst or a one-component system that is cured with heat or moisture. Alternatively, the tinted anti-splinter material may be cured by a combination of heat, moisture and/or ultraviolet light, such as by being semi-cured with heat or moisture followed by a final curing with ultraviolet light, or by being semi-cured by ultraviolet light followed by a final curing with heat or moisture. In an instance in which the tube is determined to be longer than is desired, the tube may be cut to the desired length after the anti-splinter material has been cured. Once the tinted anti-splinter material has been cured, the maskant 32 may be removed such that the interior region previously covered by the maskant is free of the tinted anti-splinter material. See block 16 of FIG. 1. Thus, even if the tinted anti-splinter material were applied to the maskant, the removal of the maskant also removes any tinted anti-splinter material that coats the maskant. Although the maskant may be removed in various manners, in the embodiment in which the maskant is in the form of a tape, the maskant may be removed by peeling the tape from the interior region of the tube.

As shown in block 18 of FIG. 1 and in FIG. 5, the method of one embodiment may also apply an optical clear adhesive 36 to the interior region of the tube 30 previously covered by the maskant 32. Various types of optical clear adhesive may be applied to the interior region of the tube that was previously covered by the maskant. In one embodiment, the optical clear adhesive is embodied as an optical clear adhesive tape that adheres to the interior region of the tube and that is covered by a protective layer, such as a protective film, on the interior surface of the optical clear adhesive that faces away from the tube. Alternatively, the optical clear adhesive may be embodied as an adhesive fluid. As a further alternative, the optical clear adhesive may be a combination of an optical clear adhesive tape and an adhesive fluid. The optical clear adhesive may have about the same thickness as the tinted anti-splinter material , such as about 0.1 mm in one embodiment. However, the optical clear adhesive may be thicker than the tinted anti-splinter material in other embodiments.

In one embodiment, the optical clear adhesive 36 is applied so as to extend beyond the interior region of the tube 30 previously covered by the maskant 32. In this regard, the optical clear adhesive includes edges that extend beyond the interior region of the tube previously covered by the maskant and overlaps the portion of the tinted anti-splinter film 34 that borders the interior region of the tube such that the tinted anti-splinter film separates the edges of the optical clear adhesive from the tube.

As shown in block 20 of FIG. 1 and in FIG. 6, an internal electronic component 38 may then be secured within the tube 38 with the optical clear adhesive 36. Various types of internal electronic components may be secured within the tube utilizing the optical clear adhesive depending upon the type of tube-shaped assembly that is to be constructed. In one embodiment, however, the internal electronic component may be a display or a touch stack. Regardless of the type of internal electronic component, the internal electronic component may be positioned within the tube in general alignment with the optical clear adhesive and, more particularly, in general alignment with the interior region previously covered by the maskant 32 that is now covered by the optical clear adhesive. The internal electronic component may then be pressed into contact with the optical clear adhesive so as to be secured within the tube-shaped assembly. In the embodiment in which the optical clear adhesive is an optical clear adhesive tape, the protective layer, such as a protective foil, may be removed, such as by peeling, from the optical clear adhesive prior to securing the internal electronic component thereto.

The resulting tube-shaped assembly is not only functional as a result of the various internal electronic components 38 secured within the tube 30, but the internal electronic components are protected by the glass or plastic tube and, in one embodiment, by the closed and seamless glass or plastic tube that protects the internal electronic components from exposure to dirt, water or other contaminants. Additionally, the resulting tube-shaped assembly may be decorative and thereby aesthetically pleasing as a result of the colorant mixed within the anti-splinter film such that the resulting tube and, therefore, the resulting tube-shaped part and the tube-shaped assembly may have a desired color. Further, the tube may protect the user even in an instance in which the tube is broken since splinters will be prevented as a result of the anti-splinter film 34 with which the interior surface of the tube is coated.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. An apparatus comprising: a glass or plastic seamless tube; a tinted antisplinter material having a colorant mixed therein that coats an interior surface of the tube, wherein the tinted antisplinter material positioned upon an interior region of the tube to define a window; an optical clear adhesive on at least a portion of the window; and an internal electronic component within the tube and secured to the optical clear adhesive in at least partial alignment with the window.

2. An apparatus according to claim 1 wherein the tinted antisplinter material has a dye or pigment mixed therein.

3. An apparatus according to claim 1 wherein the tube extends along a length between opposed longitudinal ends, wherein the tube is closed along its length and seamless along its length.

4. An apparatus according to claim 3 wherein the opposed ends are open.

5. An apparatus according to claim 1 wherein the optical clear adhesive extends beyond the window.

6. An apparatus according to claim 5 wherein edges of the optical clear adhesive overlap with the tinted antisplinter material.

7. An apparatus according to claim 1 wherein the internal electronic component comprises at least one of a display or a touch stack.

8. An apparatus according to claim 3, wherein the glass or plastic tube comprises opposed planar surfaces extending along the length and opposing arcuate side surfaces there between.

9. An apparatus according to claim 3, wherein the tube comprises an extruded tube that is cut to length.

10. An apparatus according to claim 3, wherein the tube comprises a polished exterior surface.

11. An apparatus according to claim 1, wherein the tube is tempered.

12. An apparatus according to claim 1, wherein the tube is atomic layer deposit strengthened.

13. An apparatus according to claim 1, wherein the anti-splinter material comprises a thickness of between about 0.01 millimeters and 0.20 millimeters.

14. An apparatus according to claim 1, wherein the anti-splinter material is an ultraviolet-cured anti-splinter material.

15. An apparatus according to claim 1, wherein the anti-splinter material comprises a resin and a catalyst.

* * * * *